(12) United States Patent
Doris et al.

(10) Patent No.: US 8,685,809 B2
(45) Date of Patent: Apr. 1, 2014

(54) SEMICONDUCTOR STRUCTURES HAVING IMPROVED CONTACT RESISTANCE

(75) Inventors: Bruce B. Doris, Brewster, NY (US);
Carl J. Radens, LaGrangeville, NY (US); Anthony K. Stamper, Williston, VT (US); Jay W. Strane, Warwick, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/454,709

(22) Filed: Apr. 24, 2012

(65) Prior Publication Data

US 2012/0208332 A1      Aug. 16, 2012

Related U.S. Application Data (62) Division of application No. 11/872,291, filed on Oct. 15, 2007, now Pat. No. 8,299,455.

(51) Int. Cl.
*H01L 21/336* (2006.01)

(52) U.S. Cl.
USPC ........... 438/197; 438/421; 438/3; 438/370; 438/620; 438/687; 438/618; 438/495; 257/145; 257/382; 257/377; 257/576; 257/83

(58) Field of Classification Search
USPC ........... 438/197, 421, 3, 370, 620, 687, 618, 438/495; 257/145, 382, 377, 576, 81, 91, 257/99, 343, 83
See application file for complete search history.

(56) References Cited

U.S. PATENT DOCUMENTS

| | | | | |
|---|---|---|---|---|
| 4,105,471 A | * | 8/1978 | Yerkes et al. | 136/256 |
| 4,165,241 A | * | 8/1979 | Yerkes et al. | 136/256 |
| 4,866,494 A | * | 9/1989 | Kurosawa | 257/303 |
| 5,384,485 A | * | 1/1995 | Nishida et al. | 257/751 |
| 5,412,240 A | * | 5/1995 | Inoue et al. | 257/347 |

(Continued)

FOREIGN PATENT DOCUMENTS

| | | |
|---|---|---|
| JP | 03280532 | 12/1991 |
| JP | 05315613 | 11/1993 |

(Continued)

OTHER PUBLICATIONS

International Search Report Dated Jan. 28, 2009.

(Continued)

*Primary Examiner* — Fernando L Toledo
*Assistant Examiner* — Mohammed Shamsuzzaman
(74) *Attorney, Agent, or Firm* — Scully, Scott, Murphy & Presser, P.C.; Catherine Ivers, Esq.

(57) ABSTRACT

Self-assembled polymer technology is used to form at least one ordered nanosized pattern within material that is present in a conductive contact region of a semiconductor structure. The material having the ordered, nanosized pattern is a conductive material of an interconnect structure or semiconductor source and drain diffusion regions of a field effect transistor. The presence of the ordered, nanosized pattern material within the contact region increases the overall area (i.e., interface area) for subsequent contact formation which, in turn, reduces the contact resistance of the structure. The reduction in contact resistance in turn improves the flow of current through the structure. In addition to the above, the inventive methods and structures do not affect the junction capacitance of the structure since the junction area remains unchanged.

20 Claims, 2 Drawing Sheets

(56) References Cited

U.S. PATENT DOCUMENTS

| | | | |
|---|---|---|---|
| 5,808,364 A * | 9/1998 | Cronin et al. | 257/758 |
| 5,948,470 A * | 9/1999 | Harrison et al. | 427/198 |
| 5,972,768 A * | 10/1999 | Nagayasu et al. | 438/370 |
| 6,001,717 A * | 12/1999 | Lien | 438/586 |
| 6,034,331 A * | 3/2000 | Tsukagoshi et al. | 174/250 |
| 6,287,988 B1 * | 9/2001 | Nagamine et al. | 438/770 |
| 6,593,217 B1 * | 7/2003 | Fujisawa | 438/495 |
| 6,621,131 B2 * | 9/2003 | Murthy et al. | 257/408 |
| 6,965,146 B1 * | 11/2005 | Wu | 257/328 |
| 7,102,201 B2 * | 9/2006 | Furukawa et al. | 257/382 |
| 7,160,805 B1 * | 1/2007 | Burke et al. | 438/687 |
| 7,332,370 B2 * | 2/2008 | Chang et al. | 438/102 |
| 7,459,744 B2 * | 12/2008 | Hong et al. | 257/302 |
| 7,696,542 B2 * | 4/2010 | Clevenger et al. | 257/288 |
| 7,709,369 B2 * | 5/2010 | Lee et al. | 438/620 |
| 8,039,864 B2 * | 10/2011 | Takao et al. | 257/99 |
| 2005/0009209 A1 * | 1/2005 | Zambrano | 438/3 |
| 2005/0012144 A1 * | 1/2005 | Shirai et al. | 257/329 |
| 2005/0051833 A1 * | 3/2005 | Wang et al. | 257/315 |
| 2005/0184394 A1 * | 8/2005 | Lee et al. | 257/758 |
| 2005/0287803 A1 * | 12/2005 | Lee | 438/672 |
| 2006/0011990 A1 * | 1/2006 | Furukawa et al. | 257/377 |
| 2007/0096182 A1 * | 5/2007 | Schloesser et al. | 257/296 |
| 2007/0099414 A1 * | 5/2007 | Frohberg et al. | 438/618 |
| 2007/0111408 A1 * | 5/2007 | Arao | 438/151 |
| 2007/0273042 A1 * | 11/2007 | Kuhn et al. | 257/762 |
| 2008/0001233 A1 * | 1/2008 | Kapoor et al. | 257/369 |
| 2008/0026541 A1 * | 1/2008 | Edelstein et al. | 438/421 |
| 2008/0251857 A1 * | 10/2008 | Brown | 257/382 |
| 2009/0093133 A1 * | 4/2009 | Doris et al. | 438/781 |
| 2009/0184374 A1 * | 7/2009 | Clevenger et al. | 257/368 |
| 2009/0189152 A1 * | 7/2009 | Cho et al. | 257/40 |
| 2010/0267213 A1 * | 10/2010 | Cai | 438/286 |
| 2010/0285645 A1 * | 11/2010 | Yoon et al. | 438/268 |
| 2011/0124192 A1 * | 5/2011 | Ganguli et al. | 438/653 |
| 2011/0220944 A1 * | 9/2011 | Choi et al. | 257/98 |
| 2011/0248315 A1 * | 10/2011 | Nam et al. | 257/184 |

FOREIGN PATENT DOCUMENTS

| | | |
|---|---|---|
| JP | H09069622 | 3/1997 |
| JP | 2000216238 | 8/2000 |
| JP | 2000232223 | 8/2000 |
| JP | 2001077195 | 3/2001 |
| JP | 2004253626 A | 9/2004 |
| JP | 2004260003 | 9/2004 |
| JP | 2006210927 | 8/2006 |
| JP | 2007214418 | 8/2007 |
| JP | 2007227698 | 9/2007 |
| KR | 20040065339 | 7/2004 |

OTHER PUBLICATIONS

Black, C.T., "Self Assembly in Semiconductor Microelectronics: Self-Aligned Sub-Lithographic Patterning Using Diblock Copolymer Thin Films", Proceedings of the SPIE, vol. 6153, 2006, pp. 615302-1-615302-11, XP002510882.

* cited by examiner

SEMICONDUCTOR STRUCTURES HAVING IMPROVED CONTACT RESISTANCE

CROSS REFERENCE TO RELATED APPLICATION

This application is a divisional of U.S. patent application Ser. No. 11/872,291, filed Oct. 15, 2007 the entire content and disclosure of which is incorporated herein by reference.

FIELD OF THE INVENTION

The present invention relates to semiconductor structures and methods of fabricating the same. More particularly, the present invention relates to semiconductor structures such as, for example, field effect transistors (FETs) and interconnect structures, having improved contact resistance.

BACKGROUND OF THE INVENTION

An important property of high performance semiconductor devices is the ability to conduct electricity. Current is inversely related to resistance. Traditionally, increasing the cross-section of the semiconducting material, shortening the length for the electron path, increasing the voltage, or decreasing the resistivity of the semiconducting material can all decrease resistance and increase electron flow through electrical devices.

In order to be able to make integrated circuits (ICs), such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device while maintaining the device's electrical properties. Additionally, all dimensions of the device must be scaled simultaneously in order to optimize electrical performance of a device.

One of the primary challenges to FET scaling is lowering the device's contact resistance, e.g., external resistance (also known as source/drain resistance). External resistance is the sum of all of the resistance values in a MOSFET device except for channel resistance. The external resistance is attributed to doping and diffusion of the wafer as well as the silicidation process. When scaling MOSFET devices, and if the device gate-length and the gate dielectric thickness are reduced and the contact resistance is held constant, then the performance benefits achieved through scaling will be limited.

The problem of contact resistance is not limited to FETs devices. A similar problem exists, for example, in interconnect structures in which at least one conductive filled region of an upper interconnect level mates with another conductive filled region of a lower interconnect level. As the size of these structures decrease, the area of contact is scaled in a similar manner inducing increasing contact resistance.

In view of the above, there is a continued need for providing semiconductor structures in which the contact resistance of the structure has been improved, i.e., reduced.

SUMMARY OF THE INVENTION

The present invention provides semiconductor structures in which the contact resistance of the structure has been improved, i.e., reduced, by utilizing self-assembled polymer technology to form ordered, nanosized patterns within a material present in a conductive contact region. The term "conductive contact region" as used herein refers to an area of a semiconductor structure in which a conductive material contacts another conductive material or in which a conductive material contacts a source diffusion region and/or a drain diffusion region of, for example, a FET.

The presence of the ordered, nanosized pattern within a material present in the conductive contact region increases the overall area (i.e., interface area) for contact formation, which, in turn, reduces the contact resistance of the structure. The reduction in contact resistance in turn improves the flow of current through the structure. In addition to the above, the inventive methods and structures do not affect the junction capacitance of the structure since the junction area remains unchanged.

In general terms, the present invention provides a semiconductor structure having reduced contact resistance, which comprises:

at least one conductive contact region including a material having an ordered, nanosized pattern located therein; and a conductive material contacting said material having said ordered, nanosized pattern.

The term "material" as used in the previous paragraph denotes a semiconductor source diffusion region, a semiconductor drain diffusion region, a conductive wiring region or any combination thereof.

The term "conductive material" is used in the present invention to denote any material that readily conducts electric current through electrical conduction. Examples of conductive materials include, but are not limited to an elemental metal (W, Cu, Al and the like), alloys of an elemental metal including metal semiconductor alloys, metal nitrides and combinations and multilayers thereof.

The term "semiconductor structure" is used herein to refer to any type of structure that has semiconductor properties associated therewith. Examples include CMOS structures such as, for example, FETs, with or without an interconnect structure located thereon, interconnect structures, bipolar structures, BiCMOS structures, e-fuses and MESFETs. In particular, the inventive method can be used in any type of semiconductor structure in which contact resistance is a problem.

The present invention contemplates two different embodiments. In the first embodiment, a semiconductor structure including at least one field effect transistor is provided. In the first embodiment, the source diffusion region and the drain diffusion region (hereinafter source/drain diffusion regions) each have an ordered, nanosized pattern present therein. The ordered, nanosized pattern increases the area of both diffusion regions. A metal semiconductor alloy (e.g., a metal silicide or a metal germanide) may be optionally formed on the source/drain diffusion regions which include the ordered, nanosized pattern. Further interconnect processing is then performed to provide a metallic contact to the source/drain diffusion regions.

In the first embodiment of the present invention, the inventive semiconductor structure comprises:

at least one field effect transistor located upon and within a surface of a semiconductor substrate, said at least one field effect transistor including source and drain diffusion regions located within said semiconductor substrate at a footprint of a patterned gate conductor, said source and drain diffusion regions each have an ordered, nanosized pattern located therein; and a conductive material located upon and contacting said source and drain diffusion regions including said ordered, nanosized pattern.

The conductive material may include one of the above-mentioned materials that readily conduct electric current through electrical conduction. Examples of conductive materials include, but are not limited to an elemental metal (W, Cu, Al and the like), alloys of an elemental metal including metal semiconductor alloys, metal nitrides and combinations and multilayers thereof. In one embodiment, the conductive material is a metal semiconductor alloy such as, for example, a metal silicide or a metal germanide. In another embodiment, the conductive material is a conductor that is present within an interconnect dielectric material. In yet another embodiment, the inventive structure includes a metal semiconductor alloy in direct contact with the source and drain diffusion regions and a conductor of an interconnect structure in contact with at least a portion of said metal semiconductor alloy. As is known to those skilled in the art, an interconnect structure includes an interconnect dielectric material having conductive filled openings which extend to a surface of the semiconductor substrate including the source and drain diffusion regions.

The second embodiment of the present invention provides an interconnect structure in which the contact resistance between a conductive material of an upper interconnect level and a conductive material (i.e., wiring region) of a lower interconnect level is improved. The improved contact resistance is achieved by providing an ordered, nanosized pattern to the conductive material of the lower interconnect level. The presence of the ordered, nanosized pattern in the conductive material of the lower interconnect level increases the contact region of the inventive structure.

In general terms and in accordance with a second embodiment of the present invention, the inventive interconnect structure comprises:

a first interconnect level including at least one first conductive material embedded within a first interconnect dielectric material, said at least one first conductive material having an ordered, nanosized pattern located therein; and a second interconnect level including at least one second conductive material embedded within a second interconnect dielectric material, said at least one second conductive material is present upon said ordered, nanosized pattern of said at least one first conductive material.

In addition to the various semiconductor structures mentioned above, the present invention also provides methods of fabricating the same. Each of the methods employed in the present invention combines conventional CMOS and/or interconnect technology with self-assembled polymer technology to form ordered, nanosized patterns within the contact region of the structure. The ordered, nanosized patterns provide a greater area for formation of an overlying conductive material which contacts the conductive contact region of the structure.

In general terms, the method of the present invention comprises:

providing at least one conductive contact region including a material having an ordered, nanosized pattern located therein; and providing a conductive material contacting said material having said ordered, nanosized pattern.

In regard to the FET embodiment, the inventive method includes:

providing at least one field effect transistor upon and within a surface of a semiconductor substrate, said at least one field effect transistor including source and drain diffusion regions located within said semiconductor substrate at a footprint of a patterned gate conductor, said source and drain diffusion regions each have an ordered, nanosized pattern located therein; and forming a conductive material upon and contacting said source and drain diffusion regions including said ordered, nanosized pattern.

In one embodiment, the forming the conductive material comprises forming a metal semiconductor alloy upon the source and drain diffusion regions. In yet another embodiment, the forming the conductive material comprise forming an interconnect structure having conductive filled openings that extend to the surface of the source and drain regions which may optionally include a metal semiconductor alloy layer located thereupon.

In regard to the interconnect embodiment, the inventive method includes:

providing a first interconnect level including at least one first conductive material embedded within a first interconnect dielectric material, said at least one first conductive material having an ordered, nanosized pattern located therein; and providing a second interconnect level including at least one second conductive material embedded within a second interconnect dielectric material, said at least one second conductive material is present upon said ordered, nanosized pattern of said at least one first conductive material.

DETAILED DESCRIPTION OF THE INVENTION

The present invention, which provides semiconductor structures in which the contact resistance of the structure has been improved and methods of fabricating the same, will now be described in greater detail by referring to the following description and drawings that accompany the present application. It is noted that the drawings of the present application are provided for illustrative purposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated above, self-assembled polymer technology is used to form a material having at least one ordered, nanosized pattern (pattern width of less than 50 nm) within a conductive contact region of a semiconductor structure. The material including the ordered, nanosized pattern is a conductive material of an interconnect structure or semiconductor source and drain diffusion regions of, for example, a FET. The presence of the ordered, nanosized patterned material within the contact region increases the overall area (i.e., interface area) for subsequent contact formation which, in turn, reduces the contact resistance of the structure. The reduction in contact resistance in turn improves the flow of current through the structure. In addition to the above, the inventive methods and structures do not affect the junction capacitance of the structure since the junction area remains unchanged. The term "conductive contact region" has the meaning previously indicated hereinabove.

It is noted that the method of the present invention can be used to form any type of structure/device in which contact resistance is a concern. Thus, although the two embodiments described herein below are for a CMOS structure and an interconnect structure, the invention is not limited to only those types of structures. Instead other structures/devices are contemplated such as, for example, BiCMOS, bipolar structures, e-fuses and MESFETs. In particular, the inventive method can be used in any type of semiconductor structure/device in which contact resistance is a problem.

Reference is now made to FIGS. 1-5 which represent a first embodiment of the present invention. In this first embodiment of the present invention, the contact resistance of a MOSFET is reduced. In particular, the reduced contact resistance is achieved by utilizing a component of a self-assembled polymer as an etch mask so that an ordered, nanosized pattern is formed into the semiconductor source/drain diffusion regions of a MOSFET. The ordered, nanosized pattern may be used to form a pattern such as, but not limited to spheres, cylinders and lamellae. The polymeric component that is used as the etch mask is removed and at least one conductive material such as, for example, a metal semiconductor alloy and/or a conductive material within an opening of an interconnect structure is formed over the patterned source/drain diffusion regions.

Figure 1:
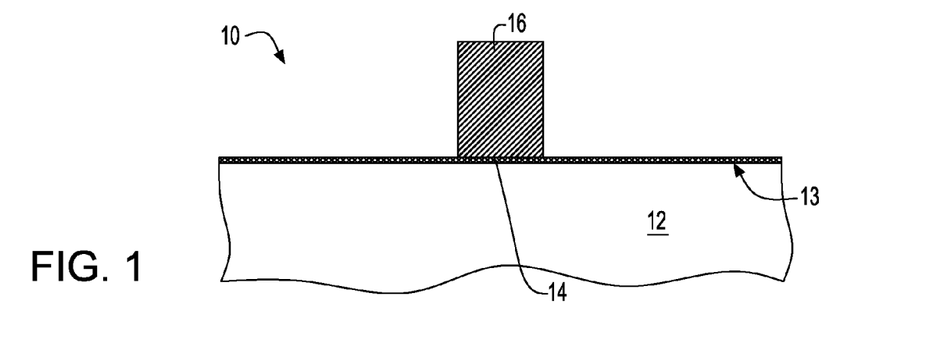
FIG. 1 is a pictorial representation (through a cross sectional view) of a semiconductor substrate having a gate dielectric and a patterned gate conductor located on a surface thereof.

FIG. 1 illustrates an initial structure 10 that is formed in this first embodiment of the present invention. The initial structure 10 includes a semiconductor substrate 12 having an upper surface 13. Atop the upper surface 13 there is a gate dielectric 14 and a patterned gate conductor 16. The initial structure shown in FIG. 1 can be formed utilizing conventional techniques well known to those skilled in the art. For example, deposition, lithography and etching can be used.

Alternatively, a replacement gate process can be used to provide the initial structure 10 shown in FIG. 1. Since both of these techniques are well known to those skilled in the art, processing details have been omitted so as not to obscure the invention.

The semiconductor substrate 12 employed in the initial structure 10 comprises any semiconducting material including, but not limited to: Si, Ge, SiGe, SiC, SiGeC, Ge, GaAs, GaN, InAs, InP and all other III/V or II/VI compound semiconductors. Semiconductor substrate 12 may also comprise a layered semiconductor such as Si/SiGe, a silicon-on-insulator (SOI), a SiGe-on-insulator (SGOI) or germanium-on-insulator (GOI). The substrate 12 may be comprised of one or more heterostructure layers such as (top-down) Si/Ge/SiGe, Ge/SiGe, Si/SiGe/Si, or SiGe/Si to serve as high-mobility channel layers. In some embodiments of the present invention, it is preferred that the semiconductor substrate 12 be composed of a Si-containing semiconductor material, i.e., a semiconductor material that includes silicon.

The semiconductor substrate 12 may be doped, undoped or contain doped and undoped regions therein. The semiconductor substrate 12 may include a single crystal orientation or it may include at least two coplanar surface regions that have different crystal orientations (the latter substrate is referred to in the art as a hybrid substrate). When a hybrid substrate is employed, an nFET is typically formed on a (100) crystal surface, while a pFET is typically formed on a (110) crystal plane. The hybrid substrate can be formed by techniques that are well known in the art.

The semiconductor substrate 12 may also include a first doped (n- or p-) region, and a second doped (n- or p-) region. For clarity, the doped regions are not specifically shown in the drawings of the present application. The first doped region and the second doped region may be the same, or they may have different conductivities and/or doping concentrations. These doped regions are known as "wells" and they are formed utilizing conventional ion implantation processes.

At least one isolation region (not shown) is typically present in the semiconductor substrate 12. The isolation region may be a trench isolation region or a field oxide isolation region. The trench isolation region is formed utilizing a conventional trench isolation process well known to those skilled in the art. The field oxide may be formed utilizing a so-called local oxidation of silicon process. Note that the at least one isolation region provides isolation between neighboring gate regions, typically required when the neighboring gates have opposite conductivities, i.e., nFETs and pFETs. The neighboring gate regions can have the same conductivity (i.e., both n- or p-type), or alternatively they can have different conductivities (i.e., one n-type and the other p-type).

After processing the semiconductor substrate 12, an oxide or oxynitride layer (not shown) is optionally formed on the surface of the semiconductor substrate 12. The optional oxide or oxynitride layer is formed utilizing a conventional growing technique that is well known to those skilled in the art including, for example, oxidation or oxynitridation. The oxide or oxynitride layer is comprised of silicon oxide, silicon oxynitride or a nitrided silicon oxide. When present, the optional oxide or oxynitride layer has a thickness that is typically from about 0.5 to about 1.2 nm, with a thickness from about 0.8 to about 1 nm being more typical. In accordance with an embodiment of the present invention, the optional oxide or oxynitride layer is a silicon oxide layer having a thickness from about 0.6 to about 0.8 nm that is formed by low-temperature (less than 750° C.) oxidation. The process step for this oxidation includes a rapid thermal process.

Next, a gate dielectric 14 is formed on the surface of the oxide or oxynitride layer, if present, or directly on the surface of the semiconductor substrate 12, if the optional oxide or oxynitride layer is not present, by a conventional deposition process and/or a thermal growing process. The gate dielectric 14 comprises any insulating oxide, nitride and/or oxynitride, with oxide containing gate dielectrics being highly preferred. The gate dielectric 14 may include silicon dioxide, silicon nitride or silicon oxynitride. In addition, the gate dielectric 14 employed in the present invention may include a metal oxide, a metal silicate, a metal silicon oxynitride and/or a mixed metal oxide. Examples of metal-containing dielectrics include $TiO_2$, $Al_2O_3$, Zr-based dielectrics, Hf-based dielectrics, $Ta_2O_5$, $La_2O_3$, perovskite-type oxides and other like dielectric materials. The term 'Hf-based dielectric' denotes hafnium oxide ($HfO_2$), hafnium silicate ($HfSiO_x$), Hf silicon oxynitride (HfSiON) or multilayers thereof. In some embodiments, the Hf-based dielectric comprises a mixture of $HfO_2$ and $ZrO_2$. The physical thickness of the gate dielectric 14 may vary, but typically, the gate dielectric 14 has a thickness from about 0.5 to about 10 nm, with a thickness from about 0.5 to about 3 nm being more typical.

Although not shown in FIG. 1, the gate dielectric 14 can also be patterned depending on the exact technique that is used in forming the initial structure 10.

Atop the gate dielectric 14 is the patterned gate conductor 16. The patterned gate conductor 16 comprises any conductive material, including, for example, doped polysilicon, doped silicon germanium, a metal, a metal alloy including a metal silicide, a metal nitride and multilayered stacks thereof. In one embodiment, the patterned gate conductor 16 is doped polysilicon. The thickness of the patterned gate conductor 16 that is formed may vary depending on the method used in forming, i.e., depositing, the same. Typically, the patterned gate conductor 16 has a thickness from about 40 to about 200 nm, with a thickness from about 70 to about 120 nm being even more typical.

In some embodiments of the present invention, a dielectric cap, i.e., hard mask, may be present atop the patterned gate conductor 16. When present, the dielectric cap typically comprises a nitride, such a silicon nitride, and it has a thickness from about 10 to about 50 nm. The dielectric cap can be used to prevent formation of a metal semiconductor alloy atop the gate conductor.

Figure 2:
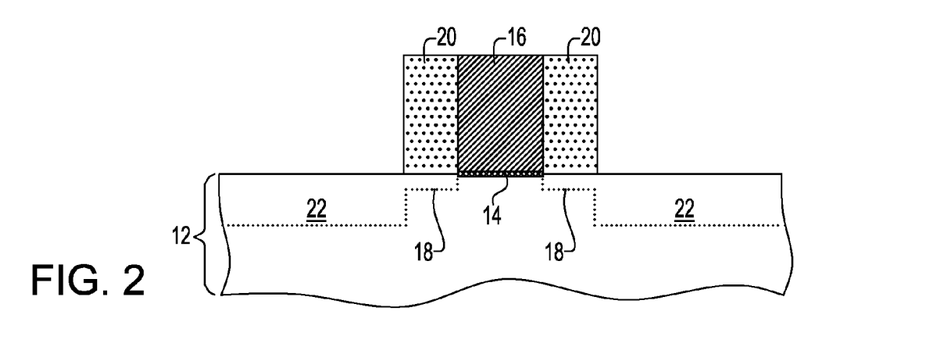
FIG. 2 is a pictorial representation (through a cross sectional view) of the structure shown in FIG. 1 after extension, spacer and source/drain diffusion region formation.

FIG. 2 shows the structure of FIG. 1 after further CMOS processing steps have been performed. Specifically, FIG. 2 shows the structure of FIG. 1 including source/drain extension regions 18, at least one sidewall spacer 20, and source/drain diffusion regions 22. The extension regions 18 are typically formed utilizing an ion implantation well known to those skilled in the art. Typically, the extension implantation is performed in the absence of sidewall spacers such that the inner edge of the extension region is aligned to the outer edge of the patterned gate conductor. After this ion implantation step, an optional anneal process may be performed to active the dopants that are implanted during the ion implantation process. The anneal may also be performed later on in the inventive process. For example, after ion implantation of the source/drain diffusion regions or during the metal semiconductor alloy formation.

If not previous performed, exposed portions of the gate dielectric 14, not covered by the patterned gate conductor 16 can be removed. It is also possible to remove the exposed positions of the gate dielectric 14 following formation of the at least one sidewall spacer 20.

The at least one sidewall spacer 20 is then typically, but not necessarily always, formed on at least the exposed sidewalls of the patterned gate conductor 16. The at least one spacer 20 is formed by deposition and etching. The at least one spacer 20 comprises any insulating material including, for example, an oxide, a nitride, an oxynitride and any combination thereof, e.g., oxide/nitride or nitride/oxide.

Next, the source/drain diffusion regions 22 are formed into the surface of the semiconductor substrate 12 utilizing a conventional ion implantation process. Halo implants may optionally be performed at this time of inventive process. Following the formation of the source/drain diffusion regions 22, an anneal process may be used to active the dopants that were implanted into the semiconductor substrate 12. The anneal may also be delayed and can be performed during a later thermal event of the inventive process, e.g., during formation of the metal semiconductor alloy.

After forming the source/drain diffusion regions 22, a layer of a self-assembled block copolymer is applied to the structure shown in FIG. 2 and then annealed to form an ordered pattern containing repeating structural units. The height of the layer of self-assembled block copolymer has a thickness that is substantially the same as the thickness of the gate conductor 16. Thus, the self-assembled block copolymer does not extend above the uppermost surface of the patterned gate conductor 16. The sidewall spacers 20 and/or the patterned gate conductor 16 serve as a mandrel for retaining the block copolymer within the area that is required to be patterned.

There are many different types of block copolymers that can be used for practicing the present invention. As long as a block copolymer contains two or more different polymeric block components that are not immiscible with one another, such two or more different polymeric block components are capable of separating into two or more different phases on a nanometer scale and thereby form patterns of isolated nano-sized structural units under suitable conditions.

In a preferred, but not necessary, embodiment of the present invention, the block copolymer consists essentially of first and second polymeric block components A and B that are immiscible with each other. The block copolymer may contain any numbers of the polymeric block components A and B arranged in any manner. The block copolymer can have either a linear or a branched structure. Preferably, such a block polymer is a linear diblock copolymer having the formula of A-B. Further, the block copolymer can have any one of the following formula:

Specific examples of suitable block copolymers that can be used for forming the structural units of the present invention may include, but are not limited to: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

The specific structural units formed by the block copolymer are determined by the molecular weight ratio between the first and second polymeric block components A and B. For example, when the ratio of the molecular weight of the first polymeric block component A over the molecular weight of the second polymeric block component B is greater than about 80:20, the block copolymer will form an ordered array of spheres composed of the second polymeric block component B in a matrix composed of the first polymeric block component A. When the ratio of the molecular weight of the first polymeric block component A over the molecular weight of the second polymeric block component B is less than about 80:20 but greater than about 60:40, the block copolymer will form an ordered array of cylinders composed of the second polymeric block component B in a matrix composed of the first polymeric block component A. When the ratio of the molecular weight of the first polymeric block component A over the molecular weight of the second polymeric block component B is less than about 60:40 but is greater than about 40:60, the block copolymer will form alternating lamellae composed of the first and second polymeric block components A and B. Therefore, the molecular weight ratio between the first and second polymeric block components A and B can be readily adjusted in the block copolymer of the present invention, in order to form desired structural units.

In a preferred embodiment of the present invention, the ratio of the molecular weight of the first polymeric block component A over the molecular weight of the second polymeric block component B ranges from about 80:20 to about 60:40, so that the block copolymer of the present invention will form an ordered array of lines composed of the second polymeric block component B in a matrix composed of the first polymeric block component A.

Preferably, one of the components A and B can be selectively removable relative to the other, thereby resulting in either isolated and orderly arranged structural units composed of the un-removed component, or a continuous structural layer containing isolated and orderly arranged cavities or trenches left by the removable component.

Figure 3:
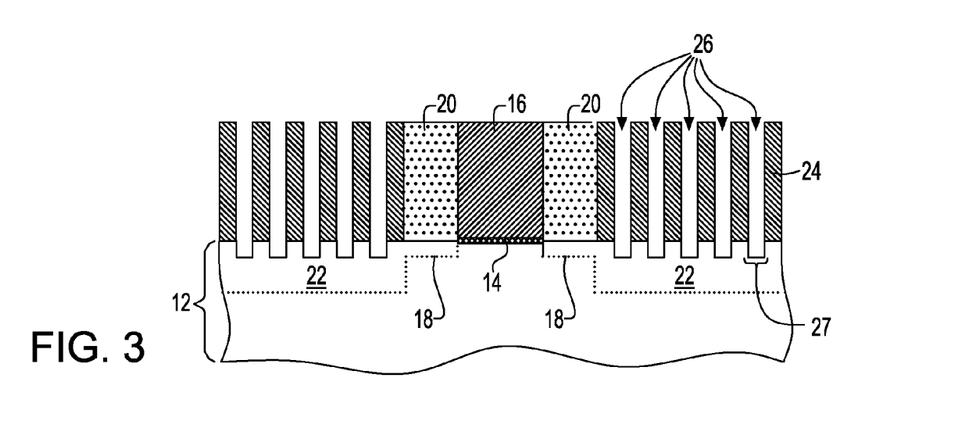
FIG. 3 is a pictorial representation (through a cross sectional view) of the structure shown in FIG. 2 after self-assembled material formation and patterning of the source/drain diffusion region.

In FIG. 3, the unremovable component of the block copolymer is labeled as reference numeral 24, while the trenches created by the removable component of the block copolymer is labeled as reference numeral 26. It is noted that although the instant embodiment illustrates the formation of a line/space pattern, the present invention is not limited to the same. Since self-assembled block copolymers are used in the inventive method each repeating unit 27 has a width of about 50 nm or less. Other types of patterns that can be patterned/formed include, for example, spheres, cylinders, or lamellae.

It is noted that the dimension of the self-assembled material pattern pitch is selected to be greater than twice the final metal semiconductor alloy metal thickness.

In a particularly preferred embodiment of the present invention, the block copolymer used for forming the self-assembled periodic patterns of the present invention is PS-b-PMMA with a PS:PMMA molecular weight ratio ranging from about 80:20 to about 60:40.

Typically, mutual repulsion between different polymeric block components in a block copolymer is characterized by the term $\chi N$, where $\chi$ is the Flory-Huggins interaction parameter and N is the degree of polymerization. The higher $\chi N$, the higher the repulsion between the different blocks in the block copolymer, and the more likely the phase separation therebetween. When $\chi N > 10$ (which is hereinafter referred to as the strong segregation limit), there is a strong tendency for the phase separation to occur between different blocks in the block copolymer.

For a PS-b-PMMA diblock copolymer, $\chi$ can be calculated as approximately $0.028 + 3.9/T$, where T is the absolute temperature. Therefore, $\chi$ is approximately 0.0362 at 473K ($\approx 200°$ C.). When the molecular weight ($M_n$) of the PS-b-PMMA diblock copolymer is approximately 64 Kg/mol, with a molecular weight ratio (PS:PMMA) of approximately 66:34, the degree of polymerization N is about 622.9, so $\chi N$ is approximately 22.5 at 200° C.

In this manner, by adjusting one or more parameters such as the composition, the total molecular weight, and the annealing temperature, the mutual compulsion between the different polymeric block components in the block copolymer of the present invention can be readily controlled to effectuate desired phase separation between the different block components. The phase separation in turn leads to formation of self-assembled periodic patterns containing ordered arrays of repeating structural units (i.e., spheres, lines, cylinders, or lamellae), as described hereinabove.

In order to form the self-assembled periodic patterns, the block copolymer is first dissolved in a suitable solvent system to form a block copolymer solution, which is then applied onto a surface to form a thin block copolymer layer, followed by annealing of the thin block copolymer layer, thereby effectuating phase separation between different polymeric block components contained in the block copolymer.

The solvent system used for dissolving the block copolymer and forming the block copolymer solution may comprise any suitable solvent, including, but not limited to: toluene, propylene glycol monomethyl ether acetate (PGMEA), propylene glycol monomethyl ether (PGME), and acetone. The block copolymer solution preferably contains the block copolymer at a concentration ranging from about 0.1% to about 2% by total weight of the solution. More preferably, the block copolymer solution contains the block copolymer at a concentration ranging from about 0.5 wt % to about 1.5 wt %. In a particularly preferred embodiment of the present invention, the block copolymer solution comprises about 0.5 wt % to about 1.5 wt % PS-b-PMMA dissolved in toluene or PGMEA.

The block copolymer solution can be applied to the surface of a device structure by any suitable techniques, including, but not limited to: spin casting, coating, spraying, ink coating, dip coating, etc. Preferably, the block copolymer solution is spin cast onto the surface of a device structure to form a thin block copolymer layer thereon.

After application of the thin block copolymer layer onto the device surface, the entire device structure is annealed to effectuate micro-phase segregation of the different block components contained by the block copolymer, thereby forming the periodic patterns with repeating structural units.

The annealing of the block copolymer can be achieved by various methods known in the art, including, but not limited to: thermal annealing (either in a vacuum or in an inert atmosphere containing nitrogen or argon), ultra-violet annealing, laser annealing, solvent vapor-assisted annealing (either at or above room temperature), and supercritical fluid-assisted annealing, which are not described in detail here in order to avoid obscuring the invention.

In a particularly preferred embodiment of the present invention, a thermal annealing step is carried out to anneal the block copolymer layer at an elevated annealing temperature that is above the glass transition temperature ($T_g$) of the block copolymer, but below the decomposition or degradation temperature ($T_d$) of the block copolymer. More preferably, the thermal annealing step is carried out an annealing temperature of about 200° C.-300° C. The thermal annealing may last from less than about 1 hour to about 100 hours, and more typically from about 1 hour to about 15 hours.

In an alternative embodiment of the present invention, the block copolymer layer is annealed by ultra-violet (UV) treatment.

Following the anneal process, one of the components of the block copolymer can be removed utilizing a solvent that is selective to that component relative to the other component of the block copolymer. The type of solvent may vary and can be, for example, selected from the following list: polar and aprotic solvents.

After removing the removable component of the block copolymer, the remaining "unremovable" component 24 serves as an etch mask. Etching is then performed to extend the trenches 26 or other patterns into the source/drain diffusion regions 22. Typically, etching is performed utilizing a dry etching process such as, for example, reactive ion etching, ion beam etching, plasma etching or laser ablation. In FIG. 3, reference numeral 27 denotes a single patterned repeating unit that was been etched into the source/drain diffusion regions 22.

Since self-assembled polymer technology is used in the inventive process, the width, W, of each single repeating unit 27 is less than 50 nm, with a width from about 10 to about 40 nm being more typical. That is, the source/drain regions 22 now include an ordered, nanosized pattern represented by single repeating units 27 that have a nanosized width. The ordered, nanosized pattern is present in the conductive contact region of the structure.

After forming the nanosized pattern within the source/drain diffusion regions 22, the remaining component of the block copolymer is removed utilizing a conventional stripping process well known to those skilled in the art. The presence of the nanosized pattern increases the area in which a metal semiconductor alloy can be subsequently formed. The increased area reduces the contact resistance of the structure without negatively impacting the scability of the structure.

Next, at least one conductive material is formed upon the source and drain diffusion regions. The at least one conductive material includes any material that that readily conducts electric current through electrical conduction. Examples of conductive materials include, but are not limited to an elemental metal (W, Cu, Al and the like), alloys of an elemental metal including metal semiconductor alloys, metal nitrides and combinations and multilayers thereof. In the drawings and in the present embodiment, the at least one conductive material includes a metal semiconductor alloy layer. Although such an embodiment is specifically described and illustrated the present invention is not limited to the same. Instead, this invention also contemplates forming the conductive filled opening of an interconnect structure in contact with the source and drain diffusion regions.

Figure 4:
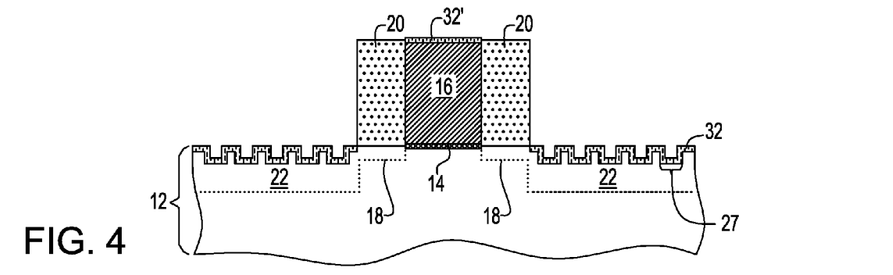
FIG. 4 is a pictorial representation (through a cross sectional view) of the structure shown in FIG. 3 after removing the self-assembled material and formation of a metal semiconductor alloy within the patterned source/drain diffusion region.

In the embodiment illustrated, the conductive material includes a metal semiconductor alloy layer 32 that is formed on the source/drain diffusion regions 22 including the exposed surfaces of the nanosized pattern that was previously formed therein. The term "metal semiconductor alloy" is used herein to denote a reaction product that is formed from thermally reacting a metal with a semiconductor material. For example, the term "metal semiconductor alloy" can be used to describe a metal silicide wherein the metal is one of Ti, W, Co, Ni, Pt, Pd, Er, Ir and other rare earth or transition metals. It could also be an alloy consisting of a combination of two or more these metals. Typically, the metal is one of Ti, W, Co and Ni. The term "metal semiconductor alloy" also describes a metal germanide including one of the above metals.

The metal semiconductor alloy layer 32 is formed by first depositing a metal that is capable of thermally reacting with a semiconductor material atop the structure shown in FIG. 3 after the remaining component of the block copolymer has been stripped from the structure. The metal is typically one of Ti, W, Co, Ni, Pt and Pd, with one of Ti, W, Co and Ni being more preferred. The metal may include an alloying additive such as, for example, C, Al, Si, Sc, Ti, V, Cr, Mn, Fe, Co, Ni, Cu, Ge, Y, Zr, Nb, Mo, Ru, Rh, Pd, In, Sn, La, Hf, Ta, W, Re, Ir, Pt, Ce, Pr, Nd, Sm, Eu, Gd, Tb, Dy, Ho Tm, Yb, Lu and mixtures thereof. When present, the alloying additive is present in amounts up to about 50 atomic percent. The metal is formed by a conventional deposition process including, for example, chemical vapor deposition, plasma enhanced chemical vapor deposition, plating, sputtering, chemical solution deposition, atomic layer deposition, physical vapor deposition and other like techniques. The alloying additive can be formed at the same time as the metal or it can be adding to the metal after deposition thereof, or it can be co-deposited atop the metal in a separate layer.

The thickness of the deposited metal can vary depending on the junction depth relative to the final thickness of the silicide formed at the upper bound and the desired resistivity at the lower bound. Typically, and for applications in FETs, the metal that is deposited has a thickness from about 5 to about 15 nm.

Following formation of the metal, an optional diffusion barrier such as TiN or TaN may be formed atop the metal prior to annealing. Annealing is performed under conditions that are sufficient in causing the metal and semiconductor to react together forming a metal semiconductor alloy layer, i.e., a metal silicide or a metal germanide. The anneal may be performed in a single step or a two-step anneal process can be used. The anneal is performed at a temperature of about 300° C. or greater, with a temperature from about 400° to about 700° C. being more typical. The optional diffusion barrier is removed after the single anneal process or after the first anneal of the two-step anneal utilizing a conventional process well known to those skilled in the art. Annealing can be performed in a forming gas, He, Ar, or $N_2$. The anneal includes a furnace anneal, a rapid thermal anneal, a spike anneal, a microwave anneal or a laser anneal. Typically, the anneal is a rapid thermal anneal in which the anneal time is about typically less than a minute. Following the final anneal step, any unreacted metal is removed from the structure.

Note that when the gate conductor 16 is composed of a Si-containing conductive material, i.e., polysilicon or silicon germanium, a metal semiconductor alloy layer 32' can also form on an upper surface of the gate conductor 16. In embodiments in which a diffusion cap is present and remains on the structure during the formation of the metal semiconductor alloy layer, no such layer is formed atop the gate conductor 16.

Figure 5:
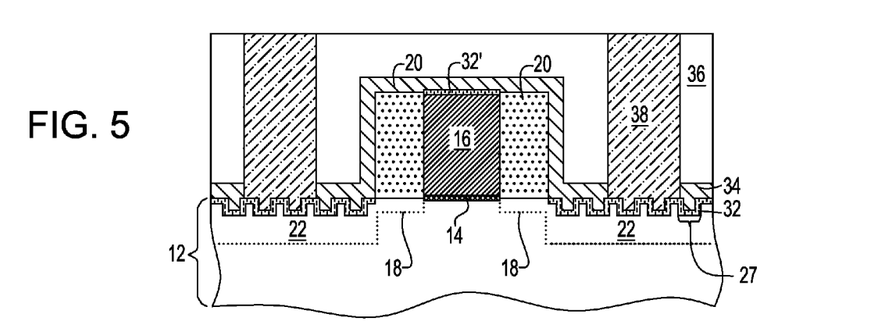
FIG. 5 is pictorial representation (through a cross sectional view) of the structure shown in FIG. 4 after forming an interconnect level.

A dielectric liner 34 comprising an oxide, nitride, oxynitride or combination thereof is typically, but not necessarily always, formed over the structure shown in FIG. 4. The dielectric liner 34 can be used to introduce stress into the device channel; the device channel, as is known to those skilled in the art, is the region of the semiconductor substrate that is beneath the gate conductor which is laterally confined by the device's source region on one side, and by the device's drain region on the other side. The dielectric liner 34 is formed utilizing a conventional deposition well known to those skilled in the art and the thickness of the dielectric liner is typically from about 20 to about 100 nm.

Next, an interconnect dielectric material 36 is formed by deposition (typically by chemical vapor deposition, plasma enhanced chemical vapor deposition or spin-on coating) and openings are formed into the interconnect dielectric material 36 by lithography and etching. The interconnect dielectric material 36 includes any dielectric material having a dielectric constant, relative to vacuum, that is about 4.0 or less. Some examples of suitable dielectrics that can be used as the interconnect dielectric material 36 include, but are not limited to: $SiO_2$, silsesquixoanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The openings are typically lined with a diffusion barrier material such as, for example, Ti, Ta, W TaN, TiN or WN, and thereafter the openings are filled (by, for example, plating) with a conductive material such as for example, W, Al, Cu or a AlCu alloy. The openings that extend to the source/drain diffusion regions are referred to as the diffusion contacts and they are labeled in the drawings by reference numeral 38. A contact to the gate conductor (not shown) is typically also formed. The resultant structure that is formed after the above steps of dielectric liner formation, and interconnect formation is shown, for example, in FIG. 5. It is emphasized that a conductively filled opening can extend directly to the surface of the semiconductor substrate including the source/drain diffusion regions.

It should be noted that although the above description and illustrations in FIGS. 1-5 show the presence of a single patterned gate conductor (and hence a single FET), the presence invention works equally well when a plurality of gate conductors (and hence FETs) are presence.

Figure 6:
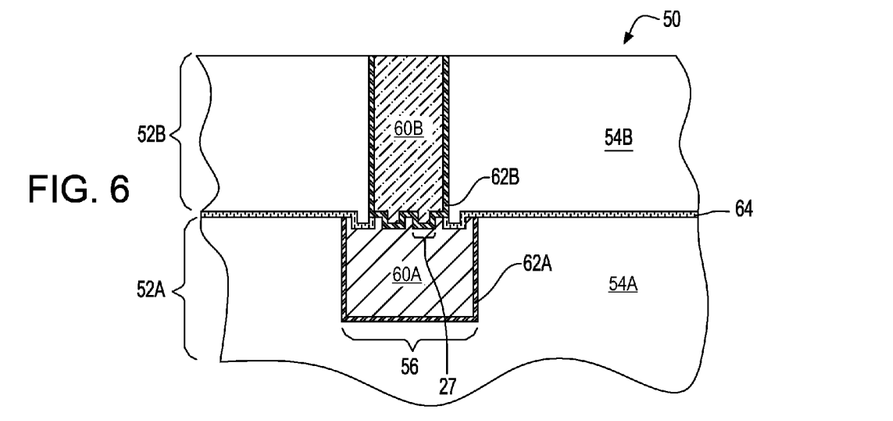
FIG. 6 is a pictorial representation (through a cross sectional view) illustrating an upper level of an interconnect structure in which a self-assembled polymer material is used in patterning the conductive material of an underlying substrate.

Reference is now made to FIG. 6 which illustrates a second embodiment of the present invention. In the second of the present invention, self-assembled polymer technology is used in improving the contact resistance of an interconnect structure 50. That is, the contact resistance is improved in a contact region between a first conductive material and a second conductive material.

The interconnect structure 50 includes a lower interconnect level 52A that comprises a first interconnect dielectric material 54A which includes at least one wiring region 56 located therein. The at least one wiring region 56 includes an opening that is filled with a conductive material 60A and is lined with a diffusion barrier 62A. The first interconnect dielectric material 54A includes one of the dielectric materials described above for dielectric material 36 in the first embodiment. The diffusion barrier includes one of Ti, Ta, W TaN, TiN and WN, and the conductive material includes, for example, doped polySi, W, Al, Cu or a AlCu alloy. The first interconnect level is formed as described above in regard to the interconnect structure shown in FIG. 5. That is, deposition is used to form the first interconnect dielectric material, and then lithography and etching are used to provide an opening in the dielectric material. A diffusion barrier is then formed by conventional means and thereafter the conductive material is filled within the opening.

The above described self-assembled polymer technology is used to pattern the conductive material 60A within the at least one wiring region 56. This provides nanosized patterns, each having a repeat unit 27, to the conductive material 60A of the first wiring region 56.

Next, a blanket dielectric capping layer 64 is formed on the surface of the lower interconnect level 52A utilizing a conventional deposition process such as, for example, CVD, PECVD, chemical solution deposition, or evaporation. The dielectric capping layer 64 comprises any suitable dielectric capping material such as, for example, SiC, $Si_4NH_3$, $SiO_2$, a carbon doped oxide, a nitrogen and hydrogen doped silicon carbide SiC(N,H) or multilayers thereof. The thickness of the capping layer 64 may vary depending on the technique used to form the same as well as the material make-up of the layer. Typically, the capping layer 64 has a thickness from about 15 to about 55 nm, with a thickness from about 25 to about 45 nm being more typical.

Next, an upper interconnect level 52B is formed by applying a second dielectric material 54B to the upper exposed surface of the capping layer 64. The second dielectric material 54B may comprise the same or different, preferably the same, dielectric material as that of the first dielectric material 54A of the lower interconnect level 52A. The processing techniques and thickness ranges for the first dielectric material 54A are also applicable here for the second dielectric material 54B.

At least one opening is then formed into the second dielectric material 54B by lithography and etching. During the etching process, the dielectric capping layer within the at least one opening is removed. Next a diffusion barrier 62B and a conductive material 60B is formed within the at least one opening. The diffusion barrier 62B may comprise the same or different materials as used for diffusion barrier 62A, likewise, the conductive material 60B may comprise the same or different conductive material as conductive material 60A. After the filling of the at least one opening with the conductive material 60B a conventional planarization such as, for example, chemical mechanical polishing may be employed to provide a planar interconnect structure as shown in FIG. 6.

It is noted that in both embodiments described above, self-assembled polymer technology is used to form at least one nanosized (repeating unit pattern width of less than 50 nm) patterned region within a contact region of a semiconductor structure. The presence of the nanosized patterned region increases the overall area (i.e., interface area) for contact formation which, in turn, reduces the contact resistance of the structure. The reduction in contact resistance in turn improves the flow of current through the structure. In addition to the above, the inventive methods and structures do not affect the junction capacitance of the structure since the junction area remains unchanged.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. A method of forming a semiconductor structure having reduced contact resistance comprising:

forming at least one field effect transistor on a surface of a semiconductor substrate;

forming a source diffusion region and a drain diffusion region within said semiconductor substrate at a footprint of said at least one field effect transistor;

patterning said source diffusion region and said drain diffusion region utilizing a self-assembled block copolymer as an etch mask;

etching to form an ordered, nanosized pattern within each of said source diffusion region and drain diffusion region, wherein said ordered nanosized pattern comprises a plurality of openings extending into a semiconductor material of said source diffusion region and said drain diffusion region, each opening has a pair of vertical sidewalls and a planar bottommost surface portion; and forming a conductive material comprising a metal semiconductor alloy directly contacting an uppermost semiconductor surface of said source diffusion region and said drain diffusion region located adjacent to each opening, and directly contacting said semiconductor material of said source diffusion region and said drain diffusion region located at said sidewalls and said planar bottommost surface portion of each of said openings, wherein said conductive material within said opening does not completely fill each of said openings.

2. The method of claim 1 wherein said self-assembled block copolymer is selected from the group consisting of polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

3. The method of claim 1 wherein said self-assembled block copolymer is formed by applying said block copolymer to a surface of each of the source diffusion region and the drain diffusion region, annealing to form an ordered array of removable and unremovable polymer components, and removing said removable polymer components.

4. The method of claim 3 wherein said applying comprises spin casting, coating, spraying, ink coating or dip coating.

5. The method of claim 4 wherein said applying is spin casting a block copolymer solution.

6. The method of claim 3 wherein said annealing comprises thermal annealing, ultra-violet annealing, laser annealing, solvent vapor-assisted annealing or supercritical fluid-assisted annealing.

7. The method of claim 6 wherein said annealing is thermal annealing that is performed at a temperature from about 200° to about 300° C.

8. The method of claim 1 wherein said etching comprises reactive ion etching.

9. The method of claim 1 further comprising forming an interconnect structure atop said semiconductor substrate, said interconnect structure including a conductive filled opening within an interconnect dielectric material that extends to said source diffusion region and said drain diffusion region.

10. The method of claim 1 wherein said forming said metal semiconductor alloy comprises depositing a metal atop at least the source diffusion region and the drain diffusion region and annealing.

11. The method of claim 10 wherein said metal semiconductor alloy is a metal silicide or a metal germanide.

12. The method of claim 1, wherein said self-assembled block copolymer is formed by applying said block copolymer to a surface of each of the source diffusion region and the drain diffusion region, UV treating said block copolymer to form an ordered array of removable and unremovable polymer components, and removing said removable polymer components.

13. The method of claim 1 wherein each opening has a width of less than 50 nm.

14. The method of method of claim 1 wherein each opening has a width from 10 nm to 40 nm.

15. The method of claim 1 wherein said at least one field effect transistor includes a gate dielectric and a gate conductor, wherein said gate dielectric has outer edges that are vertically coincident with outer edges of said gate conductor.

16. The method of claim 15 further comprising forming a spacer on said outer edges of said gate conductor and said gate dielectric, prior to said forming said source diffusion region and said drain diffusion region within said semiconductor substrate.

17. The method of claim 15 wherein said ordered, nano-sized pattern within each of said source diffusion region and drain diffusion region, is spaced apart from said gate dielectric and said gate conductor by a width of said spacer.

18. The method of claim 15 wherein an uppermost surface of said assembled block copolymer does not extend above an uppermost of said gate conductor.

19. The method of claim 16, further comprising forming a dielectric liner on an upper surface of the conductive material and atop said spacer and said gate conductor.

20. The method of claim 15 wherein during said forming said conductive material comprising said metal semiconductor alloy on said uppermost semiconductor surface of said source diffusion region and said drain diffusion region, a conductive material portion forms simultaneously on said gate conductor.

* * * * *